US011696396B2

(12) United States Patent
Foong et al.

(10) Patent No.: US 11,696,396 B2
(45) Date of Patent: Jul. 4, 2023

(54) SHORT INTERCONNECT ASSEMBLY WITH STRIP ELASTOMER

(71) Applicant: JF MICROTECHNOLOGY SDN. BHD, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY); Grace Ann Nee Yee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 0 days.

(21) Appl. No.: 17/585,363

(22) Filed: Jan. 26, 2022

(65) Prior Publication Data

US 2022/0151063 A1 May 12, 2022

Related U.S. Application Data

(63) Continuation of application No. 17/344,499, filed on Jun. 10, 2021, now Pat. No. 11,266,015.

(30) Foreign Application Priority Data

Jun. 11, 2020 (MY) .............................. PI2020003001

(51) Int. Cl.
H05K 1/02 (2006.01)

(52) U.S. Cl.
CPC ......... *H05K 1/0296* (2013.01); *H05K 1/0268* (2013.01); *H05K 1/0283* (2013.01); *H05K 2201/1078* (2013.01); *H05K 2201/1084* (2013.01); *H05K 2201/10704* (2013.01); *H05K 2201/10795* (2013.01)

(58) Field of Classification Search
CPC .. H01R 12/585; H05K 1/0268; H05K 1/0283; H05K 1/0296
See application file for complete search history.

(56) References Cited

U.S. PATENT DOCUMENTS

| 5,329,227 | A | 7/1994 | Sinclair |
| 5,764,072 | A | 6/1998 | Kister |
| 2007/0229103 | A1* | 10/2007 | Tani ..................... G01R 1/0483 324/754.08 |
| 2008/0048685 | A1 | 2/2008 | Chui |
| 2012/0049877 | A1 | 3/2012 | Rathburn |
| 2015/0168451 | A1 | 6/2015 | Foong |

* cited by examiner

*Primary Examiner* — Jeremy C Norris
(74) *Attorney, Agent, or Firm* — Maschoff Brennan

(57) ABSTRACT

An electrical contact assembly that uses an elastomer strip for each row of individual contacts. Each contact comprises a rigid bottom pin and a flexible top pin with a pair of arms which extend over and slide along sloped surfaces of the bottom contact. The elastomer strip is located between rows of the bottom and top pins. A bottom socket housing is provided with grooves which receive each elastomer strip. A row of top pins is then placed over each elastomer strip, and through ducts in the bottom socket housing. Bottom pins are then snapped into place in between the pair of arms.

5 Claims, 10 Drawing Sheets

SHORT INTERCONNECT ASSEMBLY WITH STRIP ELASTOMER

FIELD OF INVENTION

The present invention relates generally to an integrated circuit (IC) testing apparatus, and more specifically to an integrated circuit (IC) testing apparatus with elastomer strips.

BACKGROUND OF INVENTION

An integrated circuit (IC) device testing apparatus is used to evaluate performance of the IC device, and to remove from further production those IC devices that are faulty. Many solutions exist for effective electrical connection between the leads of the IC device and that of the testing apparatus, and they are known as interconnect assemblies. One type of interconnect assembly is a matrix type which is used to test ball grid array (BGA) devices, and it allows for the testing of IC devices that have leads over any portion of its entire surface. Interconnect assemblies of this matrix type must have electrical contact pins arranged in a matrix, as opposed to only at the outer edges of the IC device. It is preferable that the electrical contact pins can be easily customized so that multiple configurations of IC devices can be tested.

U.S. Pat. No. 9,817,026 (Edwards, et al) teaches of such an interconnect assembly, employing a matrix of electrical contact pins for electrical connection between the IC device being tested and the testing apparatus. One problem with interconnect assemblies such as that taught by Edwards et al is that the upper pin 22 and lower pin 62 are only held in contact with each other by the constrictive force from the surrounding honeycomb shaped elastomer 80. This design requires pressing of the elastomer against all sides of the moving pins, which generates friction between the elastomer and pins during testing. This friction can cause the upper pin to become stuck and thus delay its upwards retraction as the IC device and testing apparatus are separated from each other. As there are tens of thousands of test cycles an hour, any delay in the movement of the pins is not desirable.

Furthermore, the rubber honeycomb loses elasticity over time, and this causes a reduction in clamping force on the pins, thus reducing the quality of contact between the upper and lower pins. This increases the chances of a contact failure.

Yet another problem with this design is the inability to maintain the temperature of the testing environment. One type of test carried out on IC devices is called tri-temperature testing. This is when the testing environment is set at three different temperatures, roughly −40° C., ambient, and 150° C. To maintain the testing environment at this temperature, air is heated or cooled to the desired testing temperature and circulated around the testing environment. Air flow around the interconnect assembly causes it to reach the desired testing temperature. In Edward et al's design, the sheer volume and shape taken by the elastomer restricts air circulation around the interconnect assembly, thus making it difficult to maintain the interconnect assembly at the desired temperature.

Another problem with interconnect assemblies employing the sheet type elastomers such as taught by Edwards et al is that any warping of the elastomer sheet can lead to different elastomer compression across the matrix, thus causing coplanarity issues. BGA devices require coplanarity to best control and absorb ball height variations. Another drawback with sheet elastomers is the need to handle the entire elastomer sheet during installation or rebuilding of the interconnect assembly. To make matters worse, the elastomer sheet is also prone to tearing during these installation and rebuilding processes. Cutting of the elastomer sheets to the specific pitching and size for the pin slots is a complex process that results in many rejected elastomer sheets.

Sheet type elastomer designs such as that taught in Edwards et al also suffer from high frequency signal losses during testing.

What is needed in the art is an interconnect assembly that eliminates or reduces the afore-mentioned disadvantages of friction between the elastomer and pins, loss in electrical contact quality over time and the difficulty in maintaining interconnect assembly temperature during tri-temperature testing.

SUMMARY OF INVENTION

The present invention seeks to overcome the aforementioned disadvantages by providing an electrical interconnect assembly that uses an elastomer strip for each row of individual contacts. Each contact comprises a rigid bottom pin and a flexible top pin with a pair of arms which extend over and slide along sloped surfaces of the bottom contact. The elastomer strip is located between rows of the bottom and top pins. A bottom socket housing is provided with grooves which receive each elastomer strip. A row of top pins is then placed over each elastomer strip, and through ducts in the bottom socket housing. Bottom pins are then snapped into place in between the pair of arms.

This invention thus relates to an electrical interconnect assembly for use in an integrated circuit (IC) device testing apparatus, comprising: a bottom socket housing having a plurality of grooves running parallel with respect to each other, said grooves located on an upper side of said bottom socket housing, and a plurality of ducts which pierce through from said upper side to a lower side of said bottom socket housing, said plurality of ducts spaced along each said groove; a plurality of bottom rows, each said bottom row comprising a plurality of rigid bottom pins, each said bottom pin having two planar surfaces sloping towards each other, each said bottom pin having an upper end, each said bottom pin adapted to be inserted through each said duct, and each said bottom pin formed of an electrically conductive material; a plurality of top rows, each said top row comprising a plurality of flexible top pins, each said top pin having a first and a second arm extending over said bottom pin, said arms having an inwards bias such that an inner surface of each said arm is pressed in contact with each said planar surface, said arms joined at a bifurcation of said top pin, said top pin formed of an electrically conductive material, and each said top row aligned with each said bottom row; and a plurality of elastomer strips, each said elastomer strip running along the length of each said bottom row and top row, said elastomer strip located between said upper ends of said plurality of bottom pins in each bottom row and said bifurcations of said plurality of top pins in each top row, wherein during a test of an IC device, the device is lowered onto said top pin, thereby pushing it down and compressing at least a portion of said elastomer strip while simultaneously spreading said arms as they slide down the said sloping planar surfaces.

This invention also relates to the electrical interconnect assembly for use in an integrated circuit testing apparatus above, wherein a top of said elastomer strip is adapted to fit snugly into each said bifurcation.

This invention also relates to the electrical interconnect assembly for use in an integrated circuit testing apparatus above, wherein said top pin having a top portion which contacts with an IC device, said top portion being narrower than said arms.

This invention also relates to the electrical interconnect assembly for use in an integrated circuit testing apparatus above, further comprising a top socket housing having a plurality of grooves running parallel with respect to each other, said grooves located on a lower side of said top socket housing, and a plurality of ducts which pierce through from said lower side to an upper side of said top socket housing, said plurality of ducts spaced along each said groove, each said groove adapted to receive each said top row.

This invention also relates to the electrical interconnect assembly for use in an integrated circuit testing apparatus above, wherein each said duct is adapted to have said top portion inserted through it.

This invention also relates to the electrical interconnect assembly for use in an integrated circuit testing apparatus above, wherein each said duct is large enough to have said top portion inserted through it, but not large enough for the said arms to go through it.

Other embodiments of this invention are possible with variations to the cross-sectional shape of the elastomer strip. The possible shapes of the elastomer strip can be, but are not limited to, any of the following: square, oblong, hexagon, and octagonal. In each case, the bifurcation of said top pin may be adapted to match and receive the said elastomer strip. The upper end of said bottom pin may also be adapted to match and receive the bottom of the elastomer strip.

The present invention comprises five main structural elements with a design that allows for quick assembly, and allows control of gram force by virtue of the placement of the compressible member in its design. The bottom pin and top pin comprise the electrical contacting components, while the elastomer strip acts as the spring force acting against a compressive force of the bottom and top pins. The bottom socket housing comprises grooves which hold each elastomer strip in place, and ducts that allow the bottom pin and top pin arms to be inserted through. Once each elastomer strip is secured in a bottom socket housing groove, a plurality of top pins is slid in a spaced fashion along the length of the elastomer strip, and due to the snug fit of the elastomer strip top portion within the bifurcation of the top pin, each top pin is held in place until a row is assembled, which we call the top row. Bottom pins are then snapped into place in between the flexible arms of the top pin, and are also held in place within the top pin arms and elastomer strip. The top socket housing is provided with ducts that allow the top portion of the top pin to slide through during assembly and testing. In this way, each interconnect assembly is held securely in place via an easy assembly process.

Due to the design of the interconnect assembly in the present invention, the elastomer does not wrap around the pins as in Edwards et al, and thus friction between the elastomer and pins is not only significantly less, but also does not cause any restriction in the upwards retreat of the top pin when the IC device is separated from the testing apparatus during the latter part of each test cycle. The problem of delay in movement of the top pin is thus solved in the present invention, and a high testing rate can be achieved.

The problem of a reduction in elasticity of the elastomer causing a reduction in quality of electrical contact between the pins is also solved in the present invention, as the contact force between the pins is not provided by the elastomer as in Edwards et al, but in fact by the clamping force of the top pin's arms against the bottom pin.

The problem of maintaining a temperature of the interconnect assembly during tri-temperature testing is also solved in the present invention, due to the much smaller volume of the elastomer compared to that of Edwards et al. There is thus more empty space around the pins, allowing for better air circulation and temperature conditioning of the interconnect assembly by the surrounding air.

The present invention allows a user to customize the configuration of pins on-site, as required by the particular test. While prior art methods require the entire board to be delivered pre-configured by the manufacturer, the present invention allows easy removal of the bottom and top pins by the user, on-site, so that the contact pins may be added or removed as needed to form any configuration that is required in a matrix. This is important for ball grid array IC device testing.

The singulated or strip elastomers of the present invention also allows quick and easy installation and rebuilding of the interconnect assembly, as well as replacement of faulty electrical contact pins by the user, on-site. This is in addition to the ease of removability of the bottom and top pins.

The present invention can operate under higher testing temperatures, by virtue of its design. Many prior art designs, such as the spring and pogo pin design, are susceptible to deformation at high temperatures. This does not happen with the contact pin design of the present invention.

The problem of warping of the elastomer sheet is also reduced in the present invention, thus improving coplanarity issues that is important for testing BGA devices.

The strip elastomer in the present invention also reduces high frequency signal losses compared to the sheet type elastomers. Signal integrity is a factor of the contact material, length and structural stability. The electrical contacts of this invention provide a much stronger electrical connection between each top and bottom pin, which translates to better signal integrity and lower signal losses. The contact design in Edwards has only one mating surface for each pin, compared the two in the present invention. Each contact pin also connects diagonally with each other, which creates horizontal forces during a test that tends to push the contacts away from each other, thus resulting in less signal integrity. In contrast, the design of the present invention creates a stronger electrical connection between the top and bottom pins as the top pin is lowered towards the bottom pin, due to the clamp design of the top pin. In short, designs such as Edwards have higher signal losses compared to the design of the present invention.

Other objects and advantages will be more fully apparent from the following disclosure and appended claims.

Figure 1:
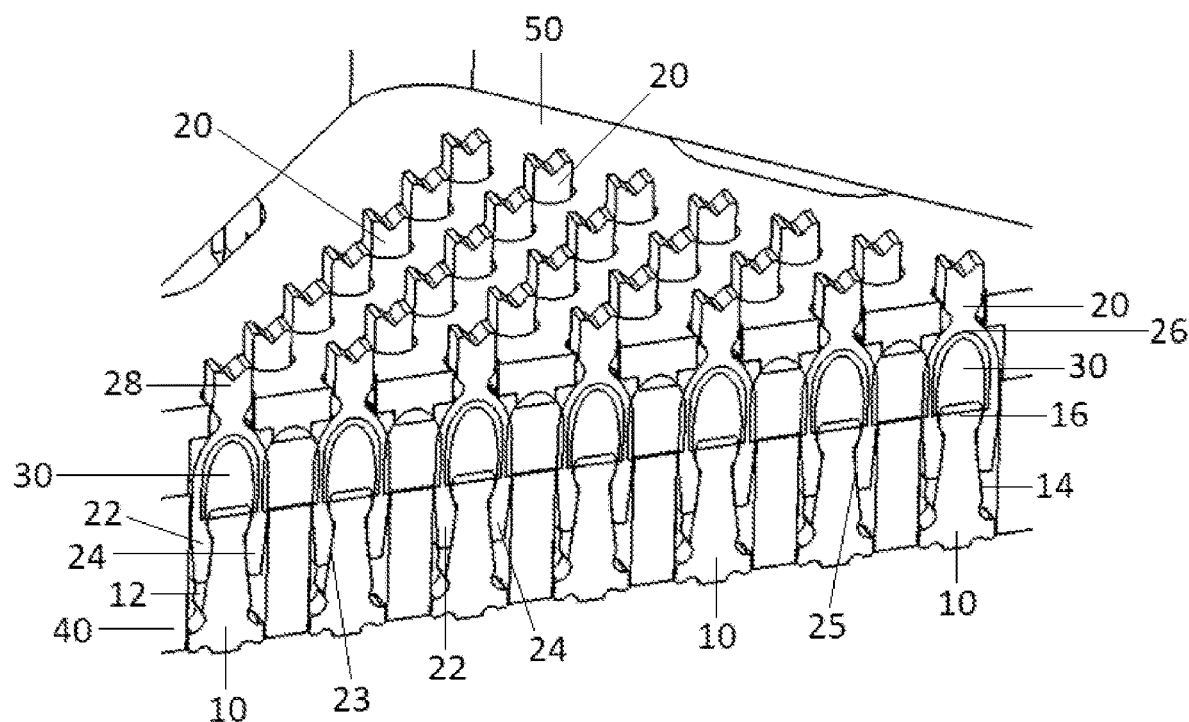
FIG. 1 shows a cross-sectional view of an electrical contact assembly in an embodiment of the present invention.

Bottom pin (10)
Left planar surface (12) of bottom pin
Right planar surface (14) of bottom pin
Upper end (16) of bottom pin
Head (18) of bottom pin
Top pin (20)
Left arm (22) of top pin
Left arm inner surface (23) of top pin
Right arm (24) of top pin
Right arm inner surface (25) of top pin
Bifurcation (26) of top pin
Top portion (28) of top pin
Elastomer strip (30)
Top (32) of elastomer strip
Bottom socket housing (40)
Grooves (42) of bottom socket housing
Ducts (44) of bottom socket housing
Upper side (46) of bottom socket housing
Lower side (48) of bottom socket housing
Top socket housing (50)
Grooves (52) of top socket housing
Ducts (54) of top socket housing
Lower side (56) of top socket housing
Upper side (58) of top socket housing

DETAILED DESCRIPTION OF INVENTION

It should be noted that the following detailed description is directed to an electrical contact of an integrated circuit testing apparatus, and is not limited to any particular size or configuration but in fact a multitude of sizes and configurations within the general scope of the following description.

Figure 2:
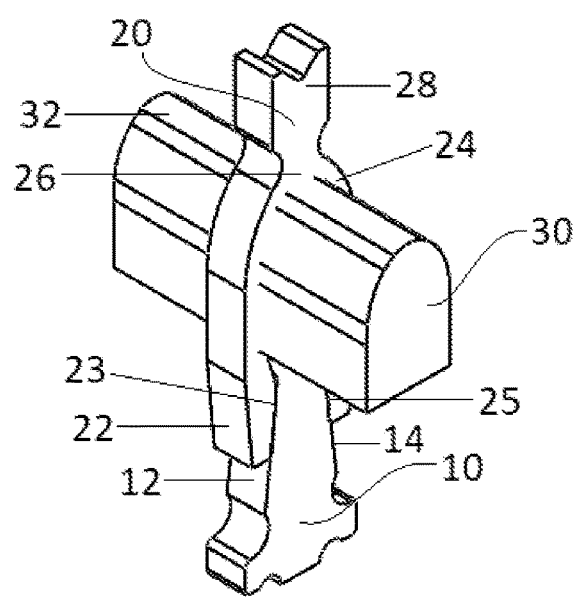
FIG. 2 shows a perspective view of an assembled bottom pin, top pin and D-shaped elastomer strip in an embodiment of the present invention.

FIG. 1 shows a cross-sectional view of a fully assembled electrical contact of an integrated circuit (IC) testing apparatus in an embodiment of this invention. FIG. 2 shows a close up view of only a bottom pin (10), top pin (20) and D-shaped elastomer strip (30) without the bottom socket housing (40) and top socket housing (50), to provide a clearer illustration of these elements. Referring to both FIG. 1 and FIG. 2, there is shown a plurality of rigid bottom pins (10) arranged in rows, each said bottom pin having a left planar surface (12) and a right planar surface (14) that slope towards each other, so that said bottom pin forms a partial wedge shape, with a narrower upper end (16) of the wedge facing upwards. Each said bottom pin (10) is connected to a corresponding top pin (20), said top pin having two arms, a left arm (22) and a right arm (24), extending over said bottom pin (10), such that the top pin forms an inverted U-shape. The top pin (20) is designed to allow flexing of the two arms (22, 24), that is, the arms (22, 24) are able to spread open from each other around a bifurcation (26) of the top pin (20), to an extent. The said arms (22, 24) are designed to have an inwards bias such that an inner surface (23) of said left arm (22) is pressed in contact with said left planar surface (12), and an inner surface (25) of said right arm (24) is pressed in contact with said right planar surface (14). In this way, during an IC device test and as the top pin (20) moves vertically with respect to the bottom pin (10), the bottom pin (10) and top pin (20) maintain a strong electrical connection with each other. The bottom pin (10) and top pin (20) can be made from any electrically conductive material with the appropriate properties that allow the bottom pin (10) to be substantially rigid, and the arms (22, 24) to flex to the desired degree. The top pin (20) has a top portion (28) which is narrower than the width of the arms (22, 24). The top portion (28) provides contact with leads on the IC device during testing.

Also shown in FIG. 1 is a plurality of elastomer strips (30). Each elastomer strip (30) is located between a row of bottom pins (10) and a row of top pins (20). Generally, each said elastomer strip (30) is partially contained on its sides by the said arms (22, 24) of the row of top pins (20), its top by the bifurcation (26) and on its bottom by the said upper end (16) of the bottom pin (10). FIG. 2 shows a clearer view of just one elastomer strip (30) with one each of the bottom pin (10) and top pin (20). Each said elastomer strip (30) is elongated along a horizontal plane, which plane is perpendicular to a vertical movement of the top pin (20) during an IC device test, and hence a direction of a compressive force applied during testing. Each elastomer strip (30) is designed to act as a compressible member, such that a compression force acting on the bottom pin (10) and top pin (20) (as happens during testing of an IC device) will cause the elastomer strip (30) to compress and thus provide an opposing force to the said compression. Simultaneously, the arms (22, 24) of the top pin (20) are forced to spread apart as their inner surfaces (23, 25) slide down over their respective sloped planar surfaces (12, 14) of the bottom pin (10). When the compressive force is released, the elastomer strip (30), acting like a spring, expands thus pushing the bottom pins (10) and top pins (20) vertically away from each other, but still in electrical contact with each other due to the inward bias of the arms (22, 24) clamping against the planar surfaces (12, 14).

Still referring to FIG. 1, during testing of an IC device, the top pin (20) is first subjected to a downwards force from an IC device (not shown) from above. When this happens, the elastomer strip (30) compresses and allows the said top pin (20) to move closer towards the bottom pin (10). As this happens, the inner surfaces (23, 25) of the said arms (22, 24) slide downwards along the sloping planar surfaces (12, 14) of the bottom pin (10), and the two arms (22, 24) of the top pin (20) flex outwards, and maintain inward pressure on the said planar surfaces (12, 14) of said bottom pin (10). When the IC device is lifted away from the testing apparatus, the elastomer strip (30) decompresses and forces the top pin (20) away from the said bottom pin (10). As this happens, the inwards pressure of the two arms (22, 24) acting on the said planar surfaces (12, 14) of bottom pin (10) keeps the inner surfaces (23, 25) of each arm in contact with the said planar surfaces (12, 14) of the said bottom pin (10). In this way, strong electrical contact is maintained throughout the testing period.

Figure 3:
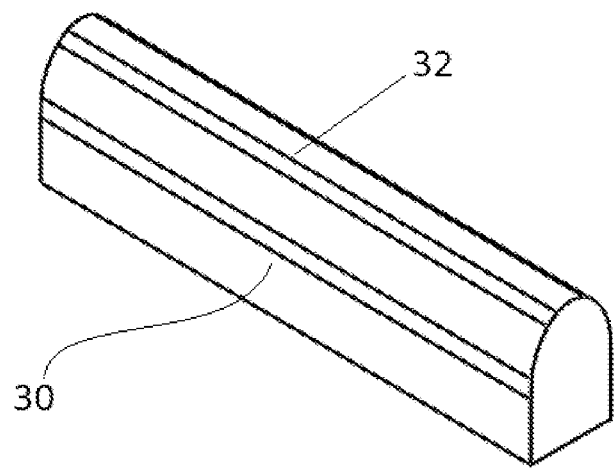
FIG. 3 shows a perspective view of a D-shaped elastomer strip in an embodiment of the present invention.

The elastomer strip (30) may be formed in a multitude of cross-sectional shapes. In a first embodiment, shown in FIG. 3, the elastomer strip (30) has a D-shaped cross-section. The curve of the "D" is facing upwards, making the top (32) of the elastomer strip (30) curved and snugly fitting into the bifurcation (26) of the top pin (20).

Figure 4:
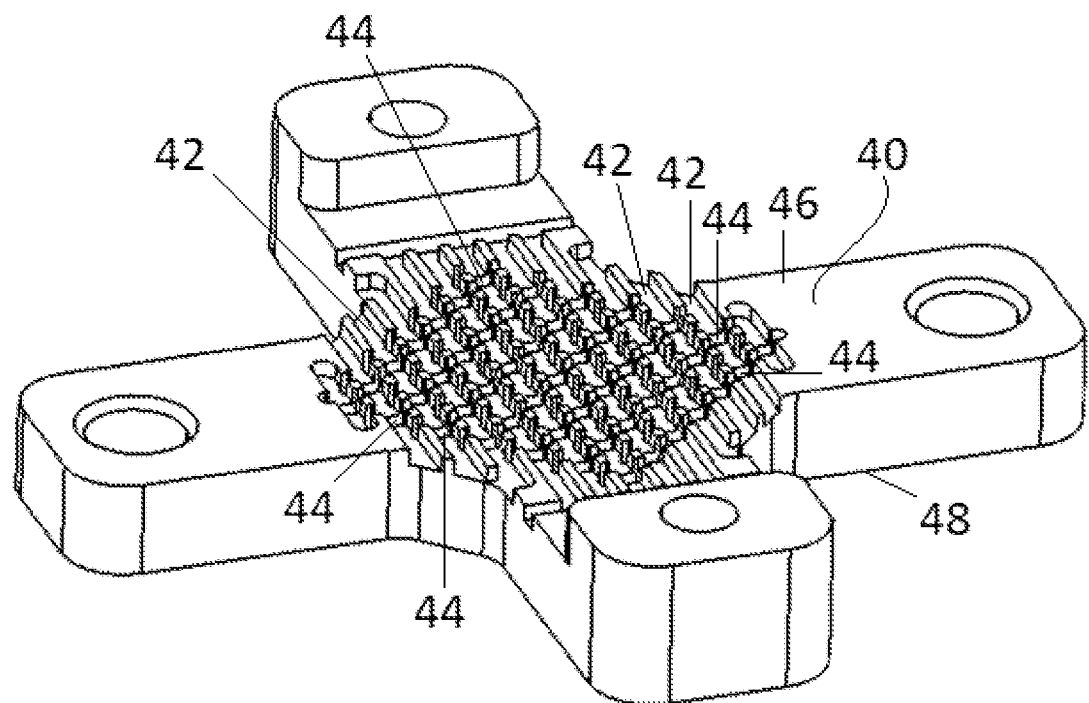
FIG. 4 shows a perspective view of a bottom socket housing in an embodiment of the present invention.

FIG. 4 shows a bottom socket housing (40) in an embodiment of this invention. Referring to FIGS. 1 and 4 now, the bottom socket housing (40) is provided with a plurality of grooves (42) that are parallel with each other and each groove (42) forming an elongated cavity along an upper side (46) of said bottom socket housing (40). The bottom socket housing (40) is also provided with a plurality of ducts (44) that vertically pierce through the bottom socket housing (40) from an upper side (46) to a lower side (48) of said bottom socket housing (40). The ducts (44) are spaced along said grooves (42). Each said elastomer strip (30) sits within said groove (42), and each pair of arms (22, 24) partially extends down through each said duct (44). Each bottom pin (10) extends upwards into each said duct (44).

Figure 5:
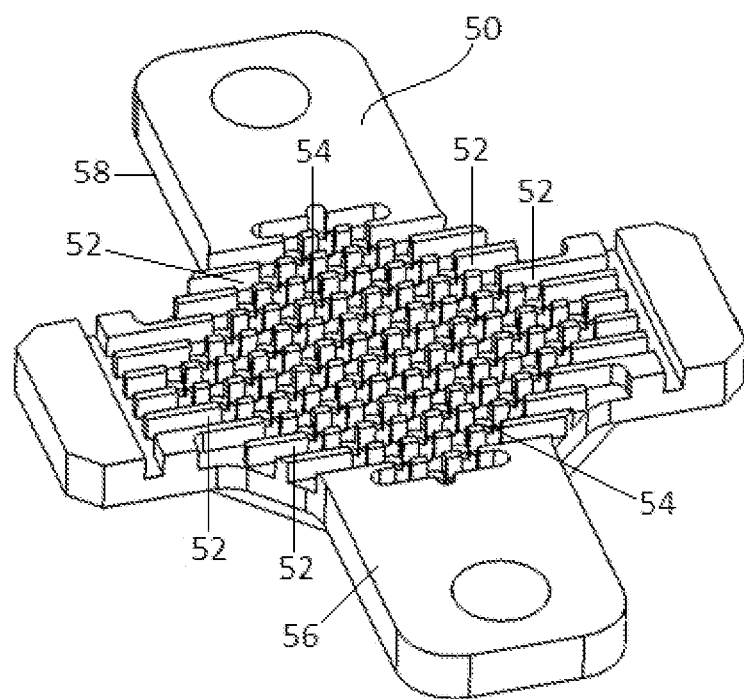
FIG. 5 shows a bottom perspective view of a top socket housing in an embodiment of the present invention.

FIG. 5 shows a top socket housing (50) in an embodiment of this invention. Referring to FIGS. 1 and 5 now, the top socket housing (50) is provided with a plurality of grooves (52) that are parallel with each other and each groove (52) forming an elongated cavity along a lower side (56) of said top socket housing (50). The top socket housing (50) is also provided with a plurality of ducts (54) that vertically pierce through the top socket housing (50) from an upper side (58) to a lower side (56) of said top socket housing (50). The ducts (54) are spaced along said grooves (52). The ducts (54) of the top socket housing (50) has a size that allows said top portion (28) of the top pin (20), but not the said arms (22, 24) to pass through.

FIGS. 6 through 13 show a sequence of a method of assembling the electrical contact in an embodiment of the present invention.

Figure 6:
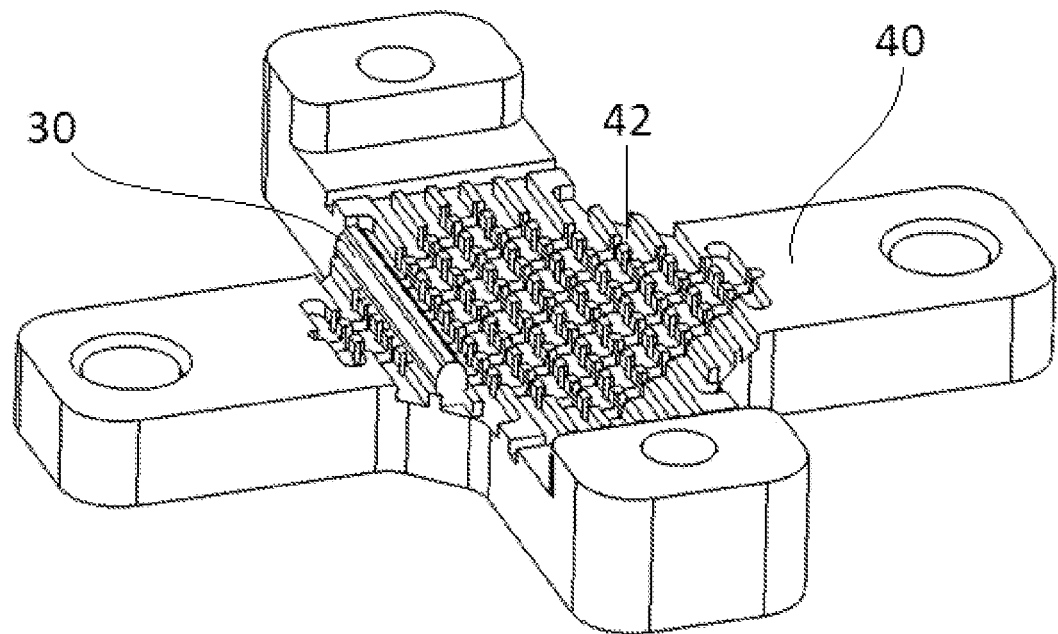
FIG. 6 shows a perspective view of a D-shaped elastomer strip assembled onto a bottom socket housing in an embodiment of the present invention.
Figure 7:
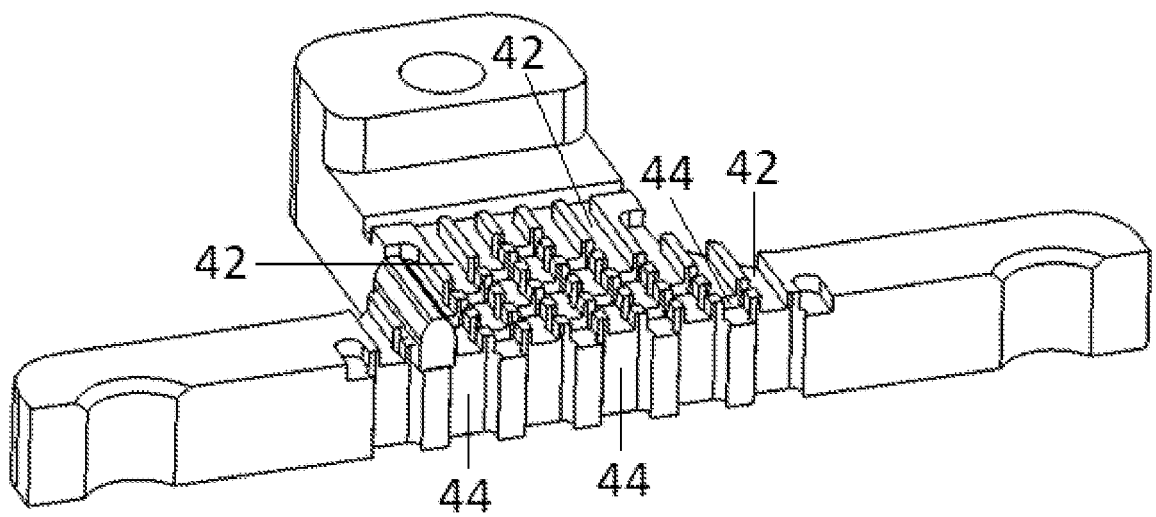
FIG. 7 shows a cross-sectional perspective view of an elastomer strip assembled onto a bottom socket housing in an embodiment of the present invention.
Figure 8:
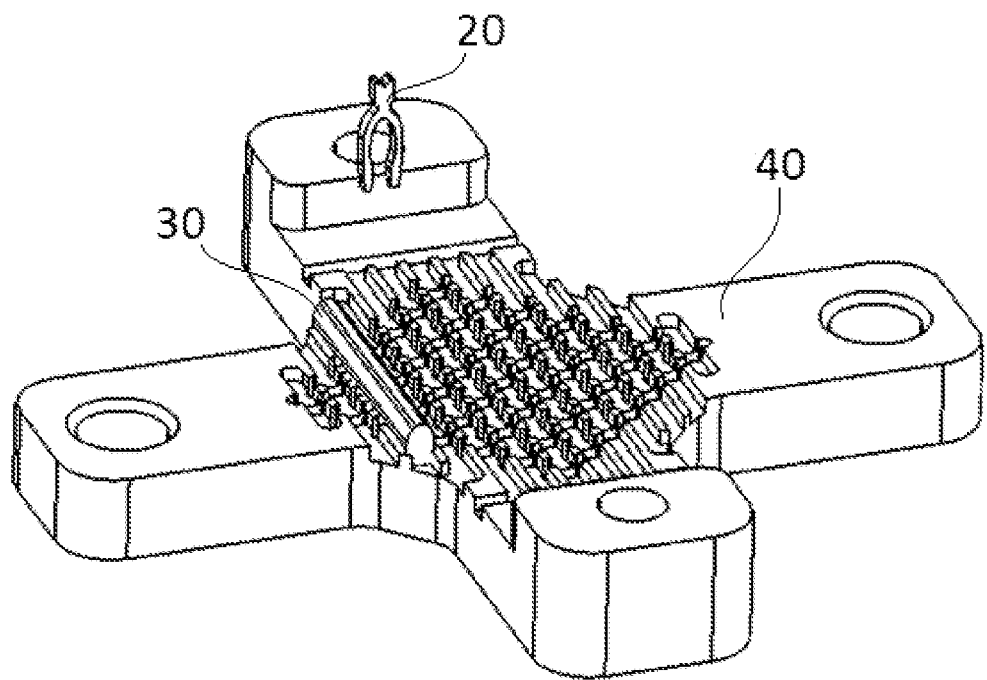
FIG. 8 shows a perspective view of a top pin being assembled onto an elastomer strip in an embodiment of the present invention.
Figure 9:
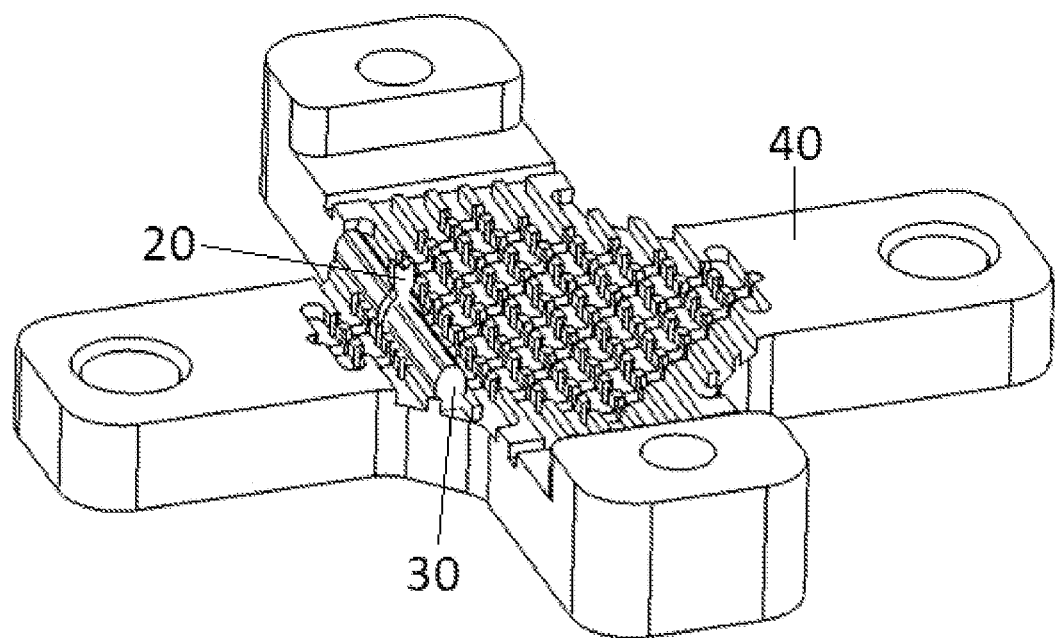
FIG. 9 shows a perspective view of a top pin assembled onto an elastomer strip in an embodiment of the present invention.
Figure 10:
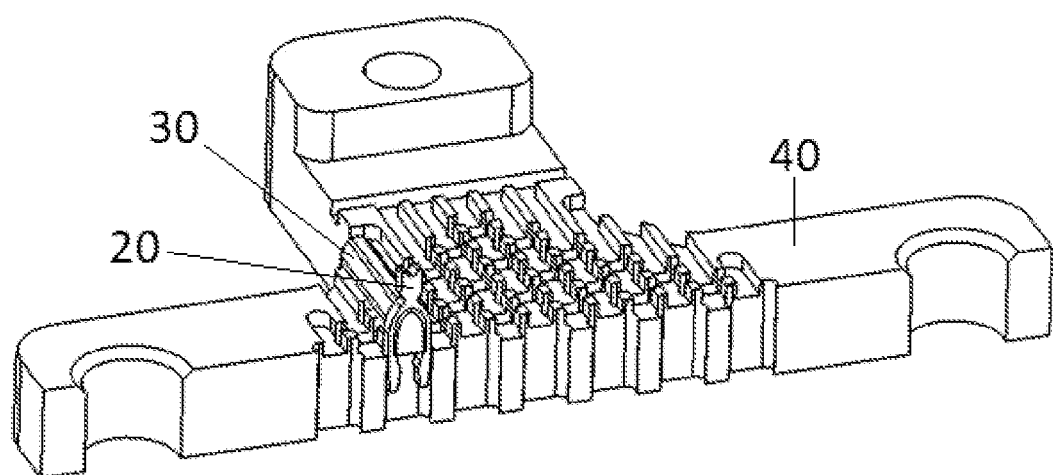
FIG. 10 shows a cross-sectional perspective view of a top pin assembled onto an elastomer strip in an embodiment of the present invention.

FIG. 6 shows a D-shaped elastomer strip (30) as it is being lowered into a groove (42) of a bottom socket housing (40). FIG. 7 shows a cross-sectional perspective view of the elastomer strip (30) assembled into the groove (42) of the bottom socket housing (40). There is also shown the ducts (44) of the bottom socket housing (40) in this figure. FIG. 8 shows a top pin (20) being lowered onto the elastomer strip (30) which has been installed on the bottom socket housing (40). FIGS. 9 and 10 shows the top pin (20) assembled onto an elastomer strip (30).

Figure 11:
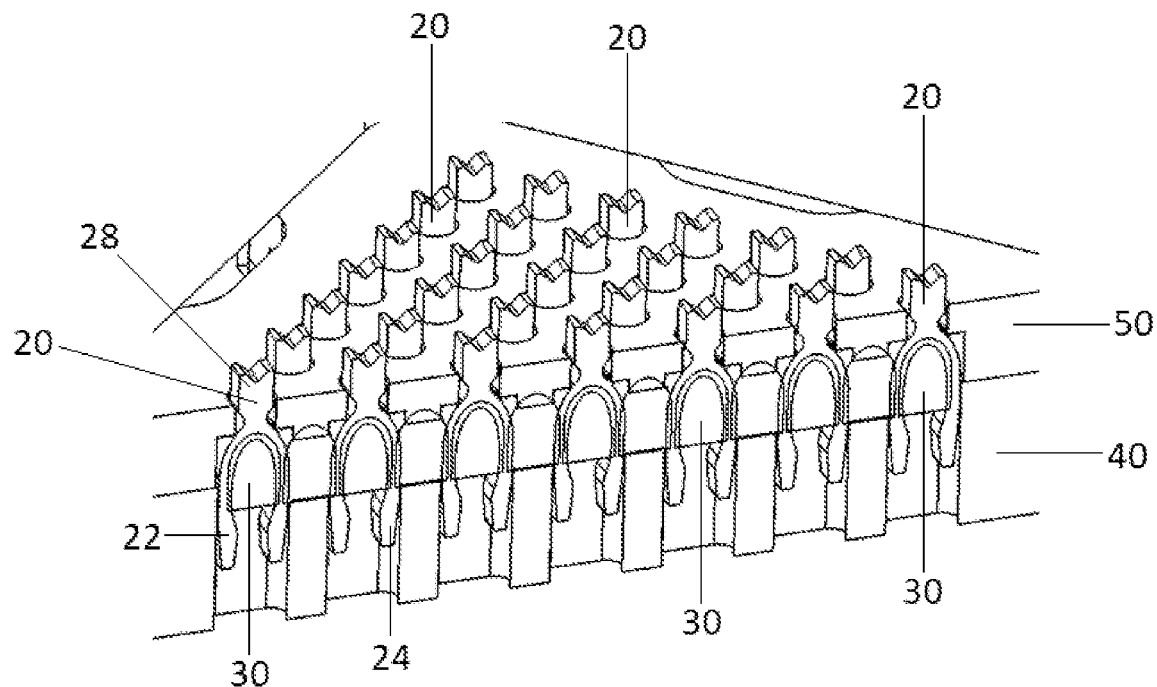
FIG. 11 shows a cross-sectional perspective view of a top socket housing assembled onto a bottom socket housing in an embodiment of the present invention.

FIG. 11 shows a top socket housing (50) assembled onto the bottom socket housing (40). It is clear from this figure that the ducts (shown in FIG. 5) in the top socket housing (50) allow only the top portion (28) of the top pin (20) to pass through, and does not allow the arms (22, 24) and the elastomer strip (30) to pass through it. In this way, the top socket housing (50) prevents the top pin (20) from upwards movement relative to the top socket housing (50). The top socket housing (50) and bottom socket housing (40) thus secure the electrical contact assembly in place.

Figure 12:
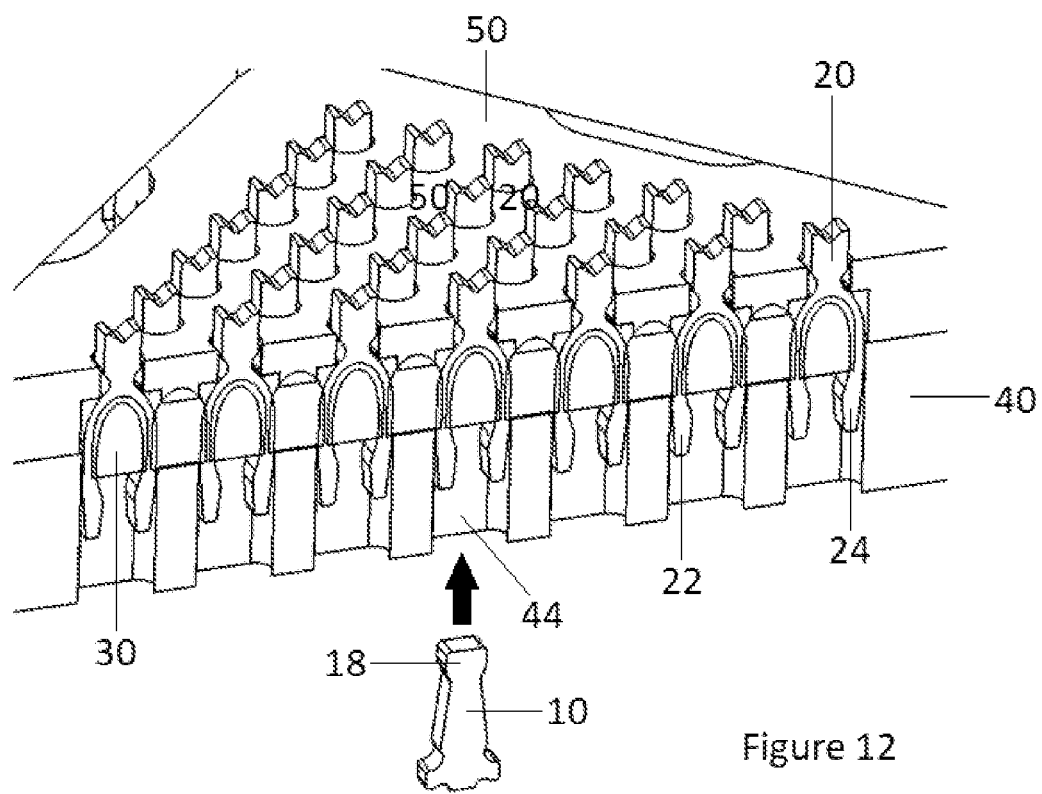
FIG. 12 shows a cross-sectional perspective view of a bottom pin being assembled into a top pin in an embodiment of the present invention.
Figure 13:
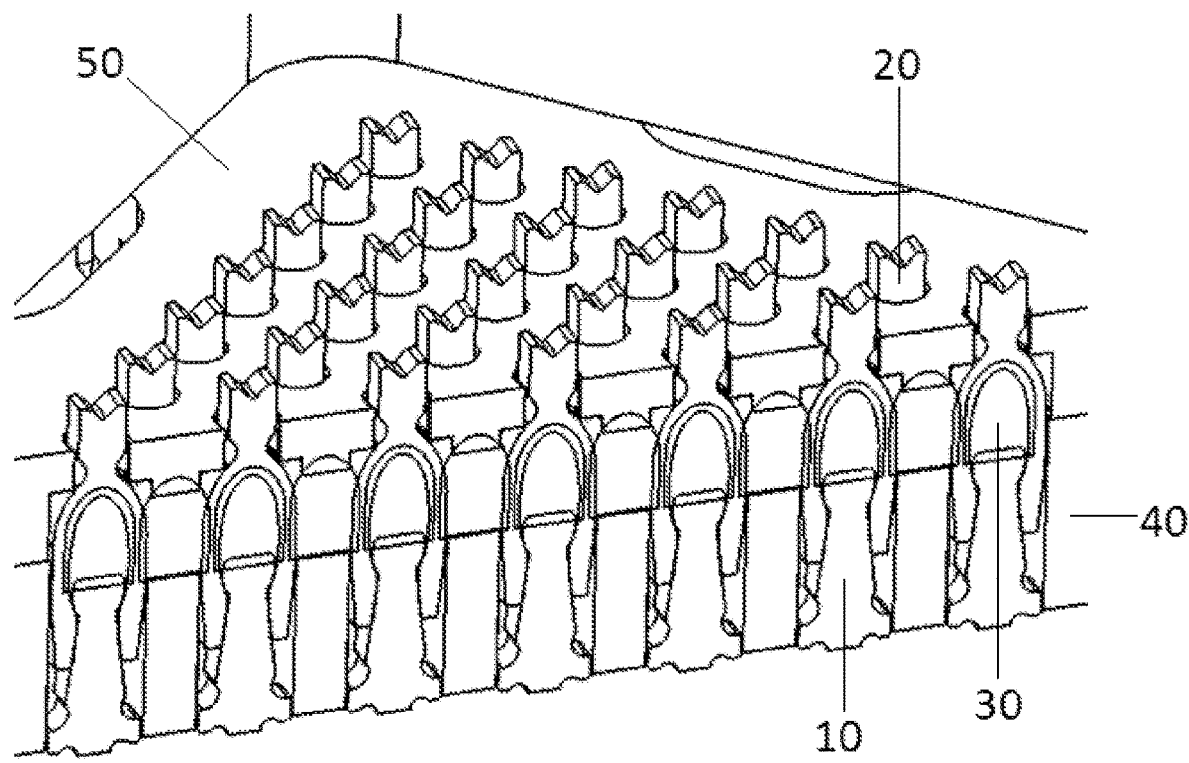
FIG. 13 shows a cross-sectional perspective view of all bottom pins assembled into all top pins in an embodiment of the present invention.

FIG. 12 shows a bottom pin (10) being raised up through a duct (44) of the bottom socket housing (40). The bottom pin (10) has a head (18) that is slightly wider than the narrowest part of its tapered section. The width of this head (18) is such that it allows the bottom pin (10) to snap into the arms (22, 24) of the top pin (20) and remain secured there. FIG. 13 shows all bottom pins (10) assembled into all top pins (20). It can be seen from this figure how the main elements of this assembly keep the assembly secured in place. In essence, the elastomer strip (30) is held up by the bottom socket housing (40). The elastomer strip (30) in turn holds up the top pins (20). The bottom pin (10) is held in place by the upwards pull of the arms (22, 24) acting on its head (18) and the downwards force of the bottom of the elastomer strip (30). Lastly, the top socket housing (50) keeps each contact from moving upwards.

Figure 14:
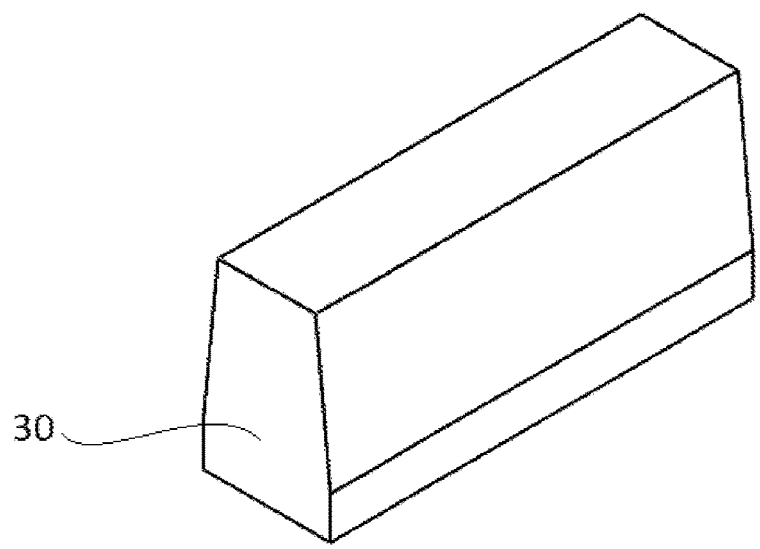
FIG. 14 shows a perspective view of a tapered elastomer strip in an embodiment of the present invention.

FIG. 14 shows an embodiment where the elastomer strip (30) has a tapered or hexagonal cross-section.

Figure 15:
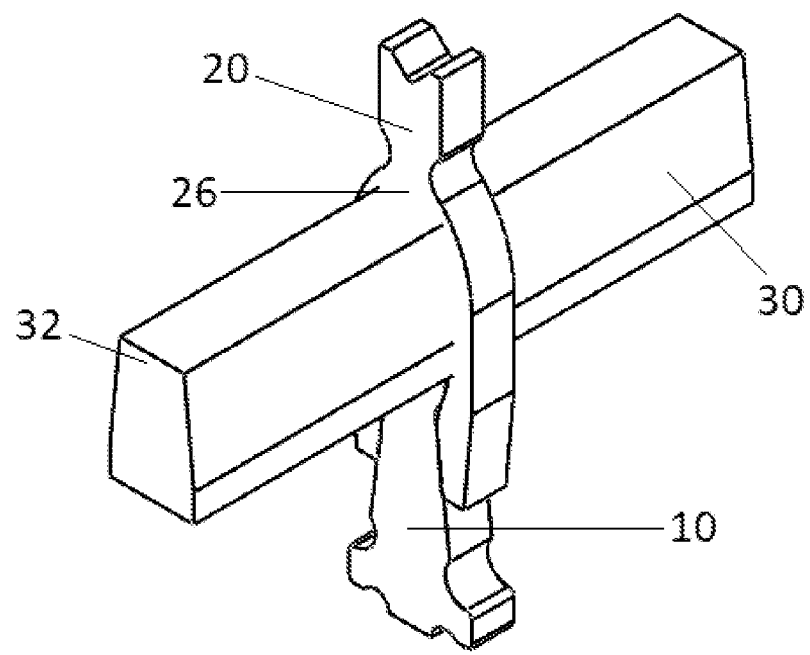
FIG. 15 shows a perspective view of an assembled bottom pin, top pin and tapered elastomer strip in an embodiment of the present invention.

FIG. 15 shows the tapered or hexagonal elastomer strip assembled with the bottom pin (10) and top pin (20). The bifurcation (26) may be shaped to matchingly receive the top (32) of the elastomer strip (30).

Figure 16:
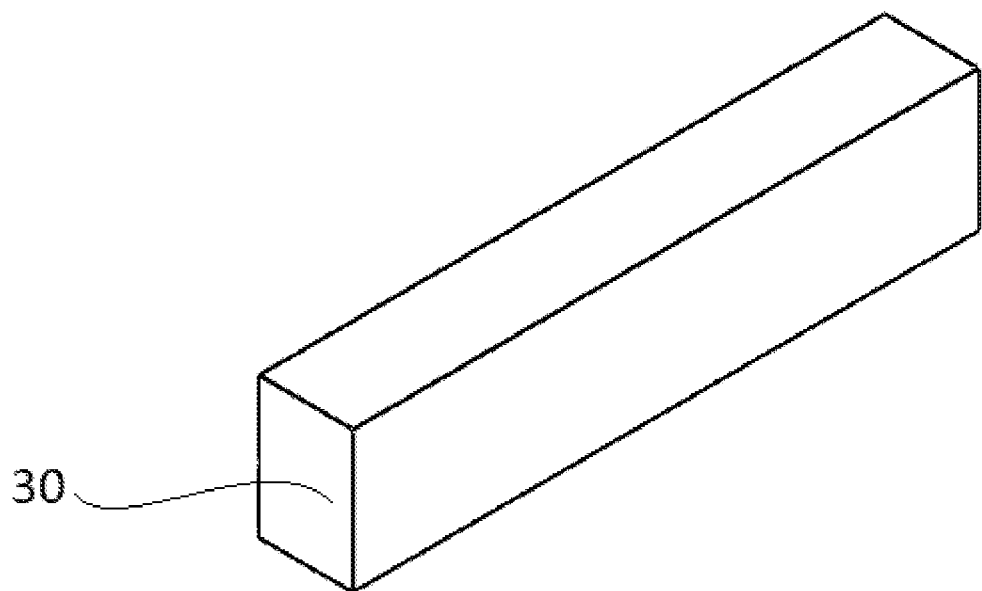
FIG. 16 shows a perspective view of a rectangular elastomer strip in an embodiment of the present invention.

FIG. 16 shows an embodiment where the elastomer strip (30) has a rectangular cross-section.

Figure 17:
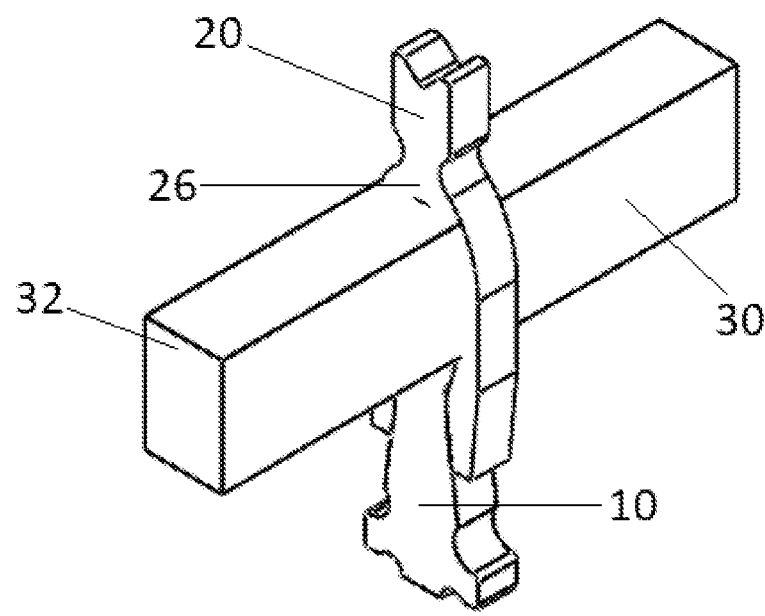
FIG. 17 shows a perspective view of an assembled bottom pin, top pin and rectangular elastomer strip in an embodiment of the present invention.

FIG. 17 shows the rectangular elastomer strip assembled with the bottom pin (10) and top pin (20). The bifurcation (26) may be shaped to matchingly receive the top (32) of the elastomer strip (30).

Figure 18:
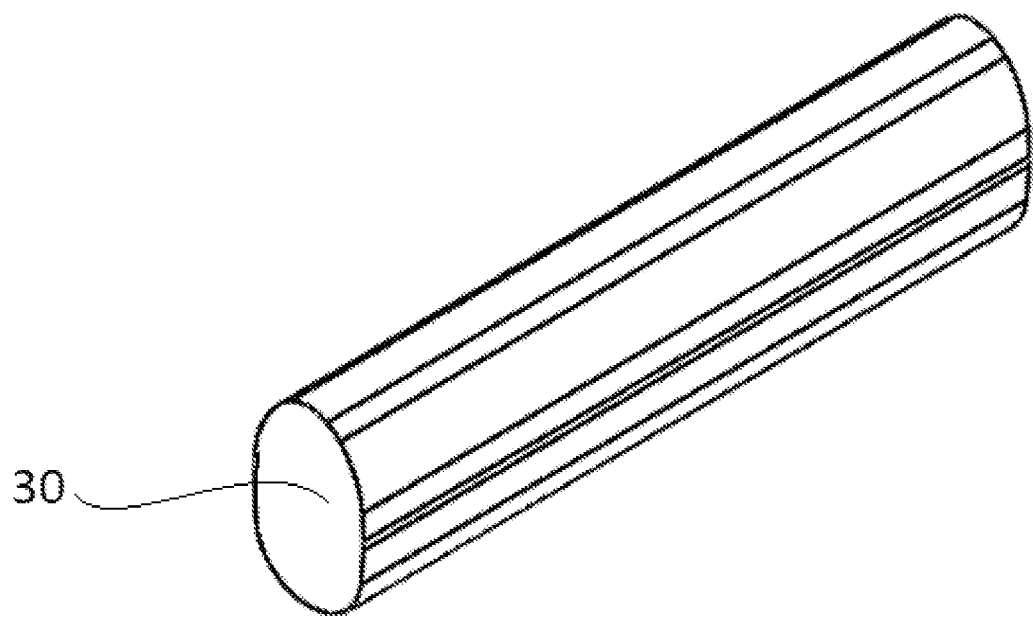
FIG. 18 shows a perspective view of an oval elastomer strip in an embodiment of the present invention.

FIG. 18 shows an embodiment where the elastomer strip (30) has an oval cross-section.

Figure 19:
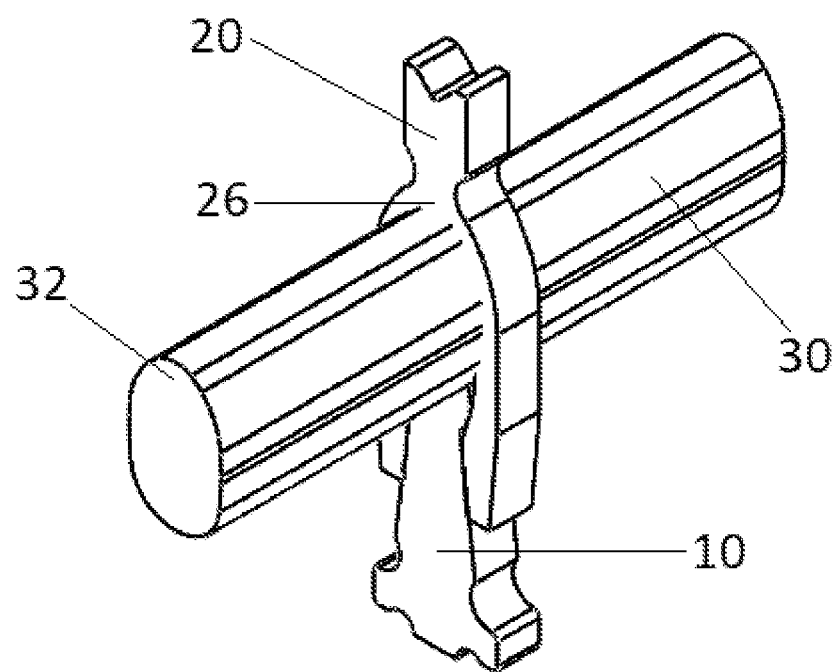
FIG. 19 shows a perspective view of an assembled bottom pin, top pin and oval elastomer strip in an embodiment of the present invention.

FIG. 19 shows the oval elastomer strip assembled with the bottom pin (10) and top pin (20). The bifurcation (26) may be shaped to matchingly receive the top (32) of the elastomer strip (30).

While several particularly preferred embodiments of the present invention have been described and illustrated, it should now be apparent to those skilled in the art that various changes and modifications can be made without departing from the scope of the invention. Accordingly, the following claims are intended to embrace such changes, modifications, and areas of application that are within the scope of this invention.

The invention claimed is:

1. An electrical contact for use in an integrated circuit (IC) device testing apparatus, comprising:
   a bottom socket housing having a plurality of horizontal grooves running parallel with respect to each other, and a plurality of vertical ducts spaced along each said groove;
   a plurality of bottom pins, each bottom pin adapted to be inserted through each said duct, said bottom pin formed of an electrically conductive material;
   a plurality of top pins, each said top pin having a first and a second arm extending over said bottom pin, said arms, having an inwards bias such that they maintain contact with said bottom pin, said top pin formed of an electrically conductive material; and
   at least one elastomer strip, said elastomer strip running parallel to said grooves, and said elastomer strip located between said plurality of bottom pins and plurality of top pins, such that it provides some resilience between the bottom and top pins.

2. An electrical contact for use in an integrated circuit testing apparatus according to claim 1, wherein said top pin having a top portion which contacts with an IC device, said top portion being narrower than said arms.

3. An electrical contact for use in an integrated circuit testing apparatus according to claim 2, further comprising a top socket housing having a plurality of horizontal grooves running parallel with respect to each other, and a plurality of vertical ducts along each said groove.

4. An electrical contact for use in an integrated circuit testing apparatus according to claim 3, wherein each said duct adapted to have said top portion inserted through it.

5. An electrical contact for use in an integrated circuit testing apparatus according to claim 3, wherein each said duct is large enough to have said top portion inserted through it, but not large enough for the said arms to go through it.

\* \* \* \* \*